United States Patent
Yan et al.

(10) Patent No.: US 11,784,625 B2
(45) Date of Patent: Oct. 10, 2023

(54) PACKAGING METHOD AND PACKAGE STRUCTURE FOR FILTER CHIP

(71) Applicant: GUANGDONG INSTITUTE OF SEMICONDUCTOR INDUSTRIAL TECHNOLOGY, Guangdong (CN)

(72) Inventors: Yingqiang Yan, Guangdong (CN); Chuan Hu, Guangdong (CN); Zhitao Chen, Guangdong (CN)

(73) Assignee: GUANGDONG INSTITUTE OF SEMICONDUCTOR INDUSTRIAL TECHNOLOGY, Guangdong (CN)

( * ) Notice: Subject to any disclaimer, the term of this patent is extended or adjusted under 35 U.S.C. 154(b) by 469 days.

(21) Appl. No.: 16/968,738

(22) PCT Filed: Dec. 11, 2019

(86) PCT No.: PCT/CN2019/124590
§ 371 (c)(1),
(2) Date: Aug. 10, 2020

(87) PCT Pub. No.: WO2021/114140
PCT Pub. Date: Jun. 17, 2021

(65) Prior Publication Data
US 2021/0184649 A1 Jun. 17, 2021

(51) Int. Cl.
*H03H 9/05* (2006.01)
*H03H 9/25* (2006.01)
(Continued)

(52) U.S. Cl.
CPC .......... *H03H 9/058* (2013.01); *H01L 23/66* (2013.01); *H03H 3/08* (2013.01); *H03H 9/25* (2013.01)

(58) Field of Classification Search
CPC .......... H01L 23/66; H03H 3/08; H03H 9/058; H03H 9/059; H03H 9/1085; H03H 9/25
See application file for complete search history.

(56) References Cited

U.S. PATENT DOCUMENTS 7,259,032 B2   8/2007   Murata et al.
8,587,389 B2   11/2013  Koga et al.
(Continued)

FOREIGN PATENT DOCUMENTS

CN   1499717 A    5/2004
CN   101689846 A  3/2010
(Continued)

OTHER PUBLICATIONS (PCT) China National Intellectual Property Administration (ISA/CN), International Search Report (with partial English translation), International Application No. PCT/CN2019/124590, 6 pages, Aug. 28, 2020.

(Continued)

*Primary Examiner* — Timothy J Thompson
*Assistant Examiner* — Rhadames Alonzo Miller
(74) *Attorney, Agent, or Firm* — Thompson Hine LLP

(57) ABSTRACT

A packaging method and package structure for a filter chip. The packaging method includes providing a circuit substrate, covering a first surface of the circuit substrate and/or filter chip with adhesive material and forming recessed cavities or closed cavities in the adhesive material. The method further includes adhering the filter chip to the first surface of circuit substrate via the adhesive material, such that surface acoustic wave transmitting regions of the filter chip correspond to the recessed cavities or closed cavities in the adhesive material to form a gap therebetween, and encapsulating the filter chip with encapsulating material. The method further includes forming interconnecting holes extending from a second surface of the circuit substrate to pins of the filter chip, filling the interconnecting holes with conductive material, so that the conductive material is in electrical contact with a chip pin bump or pad metal of the (Continued)

filter chip, and forming external pin pads on the second surface.

9 Claims, 12 Drawing Sheets

(51) Int. Cl.
    *H01L 23/66*       (2006.01)
    *H03H 3/08*        (2006.01)

(56) References Cited

U.S. PATENT DOCUMENTS

| | | | |
|---|---|---|---|
| 10,333,493 B2 | 6/2019 | Nagarkar et al. | |
| 2002/0171507 A1* | 11/2002 | Ohashi | H03H 9/72 333/133 |
| 2003/0009864 A1* | 1/2003 | Kim | H03H 9/1092 29/841 |
| 2003/0109077 A1* | 6/2003 | Kim | H01L 21/563 257/E21.503 |
| 2003/0218240 A1* | 11/2003 | Cho | H01L 23/3675 257/680 |
| 2004/0100164 A1* | 5/2004 | Murata | H03H 9/1085 310/348 |
| 2004/0124953 A1* | 7/2004 | Nakatani | H03H 9/1071 333/193 |
| 2004/0160750 A1* | 8/2004 | Masuko | H01L 24/97 29/841 |
| 2004/0207059 A1* | 10/2004 | Hong | H01L 23/3135 257/E23.126 |
| 2004/0227431 A1* | 11/2004 | Mishima | H03H 9/1071 310/313 R |
| 2005/0017823 A1* | 1/2005 | Sakano | H03H 9/72 333/133 |
| 2005/0042804 A1* | 2/2005 | Kim | H03H 3/08 438/110 |
| 2006/0250049 A1* | 11/2006 | Park | H03H 9/1085 310/344 |
| 2011/0109400 A1* | 5/2011 | Koga | H03H 9/0576 333/186 |
| 2018/0062618 A1* | 3/2018 | Nagarkar | H03H 9/1085 |

FOREIGN PATENT DOCUMENTS

| | | |
|---|---|---|
| CN | 106921357 A | 7/2017 |
| CN | 107786183 A | 3/2018 |

OTHER PUBLICATIONS (PCT) China National Intellectual Property Administration (ISA/CN), Written Opinion of the International Searching Authority (with English translation), International Application No. PCT/CN2019/124590, 9 pages, Aug. 28, 2020.

* cited by examiner

PACKAGING METHOD AND PACKAGE STRUCTURE FOR FILTER CHIP

CROSS-REFERENCE TO RELATED APPLICATIONS

This application is a national stage filing of International Application No. PCT/CN2019/124590 filed on Dec. 11, 2019, the entire contents of which is incorporated by reference herein.

TECHNICAL FIELD

The present disclosure relates to the technical field of electronic devices, and in particular to a packaging method and a package structure for a filter chip.

BACKGROUND

A surface acoustic wave (SAW) filter chip is an electronic device which converts an electric signal into an acoustic signal travelling on the surface of a substrate (i.e., a surface acoustic wave) and then converts the acoustic signal into an electric signal so as to filter the signal during the electric-acoustic-electric conversion. The surface acoustic wave filter chip has the advantages of small size, firm structure, wide frequency band, and mass productability, and thus is widely used in radar, communication, broadcasting, electronic countermeasure, and television systems. For example, at least 40 surface acoustic wave filters are required in a 4G mobile phone supporting all network communication modes, and the number of the surface acoustic wave filters to be required in a 5G mobile phone may be increased exponentially.

A part of the filter chip that transmits a surface acoustic wave should not be brought into contact with or connected to other components in order to ensure that a filtering process can be performed by the surface acoustic wave filter chip without interference, thus an enough cavity structure must be left in a package structure for the surface acoustic wave filter chip for the surface acoustic wave transmitting part of the filter chip.

In some prior technologies, the filter chip is pasted on a ceramic substrate with a cavity structure, and electrical interconnection between the filter chip and the ceramic substrate is achieve by using a wire bonding process or a flip-chip bonding process, and then the cavity is covered with a metal cover (in an airtight or non-airtight manner). In the currently prevailing process, pins and/or gold bumps are fabricated on the filter chip, and then the filter chip is bound into a cavity of a low-temperature co-fired ceramic substrate by using a hot-pressing ultrasonic process to achieve the electrical interconnection with the substrate. Conventional low-temperature co-fired ceramic substrates are machined by expensive grinding tools and by difficult processes, has low yield due to the shrinkage characteristic of ceramic cured, and hence has higher price; and moreover, the substrate has low processing size precision, resulting in a substrate having a large size and large thickness, which cannot meet the requirements for compact and ultra-thin packaging of the filter chip.

SUMMARY

In order to at least overcome the above-mentioned deficiencies in the prior art, one of the objects of the present disclosure is to provide a method of packaging a filter chip, the method comprising:

providing a circuit substrate, the circuit substrate comprising a first surface and a second surface remote from the first surface, wherein a circuit layer is pre-formed on each of the first surface and the second surface, and an interconnecting hole extending through the circuit substrate is pre-formed in the circuit substrate;

fabricating a filtering functional layer on the filter chip;

covering the first surface of the circuit substrate and/or the filter chip with an adhesive material and forming a recessed cavity or a closed cavity in the adhesive material;

adhering the filter chip to the first surface of the circuit substrate via the adhesive material, such that a surface acoustic wave transmitting region of the filter chip corresponds to the recessed cavity or closed cavity in the adhesive material to form a gap therebetween;

encapsulating the filter chip with an encapsulating material;

forming an interconnecting hole extending from the second surface to a pin of the filter chip to expose a chip pin bump or pad metal;

filling the interconnecting hole with a conductive material, so that the conductive material is in electrical contact with the chip pin bump or pad metal of the filter chip; and forming, on the second surface, an external pin pad electrically connected to the chip pin bump or pad metal of the filter chip via the interconnecting hole.

In a possible implementation of the present disclosure, the step of covering the first surface and/or the filter chip with an adhesive material and forming a recessed cavity in the adhesive material includes:

covering the filter chip with an adhesive material; and partially removing the adhesive material at a position corresponding to the surface acoustic wave transmitting region to form a recessed cavity from which the surface acoustic wave transmitting region is exposed, so that a cavity wall at least partially surrounding the surface acoustic wave transmitting region is formed by the adhesive material.

In a possible implementation of the present disclosure, the step of covering the first surface and/or the chip with an adhesive material and forming a closed cavity in the adhesive material includes:

covering the chip with a first adhesive material;

partially removing the first adhesive material to form a recessed cavity corresponding to the surface acoustic wave transmitting region; and using a second adhesive material to close the recessed cavity, so that a closed cavity enclosing the surface acoustic wave transmitting region is formed by the first adhesive material together with the second adhesive material.

In a possible implementation of the present disclosure, the step of covering the first surface and/or the chip with an adhesive material and forming a recessed cavity in the adhesive material includes:

covering the first surface with an adhesive material; and partially removing the adhesive material to form a recessed cavity.

In a possible implementation of the present disclosure, the step of covering the first surface and/or the chip with an adhesive material and forming a recessed cavity in the adhesive material includes:

covering the first surface with an adhesive material and partially removing the adhesive material to form a recessed cavity; and the step of adhering the filter chip to the first surface of the circuit substrate via the adhesive material includes:

adhering, onto the adhesive material, the filter chip having protrusions on a side where the surface acoustic wave transmitting region is located, so that the surface acoustic wave transmitting region corresponds to the recessed cavity in the adhesive material to form a gap therebetween.

In a possible implementation of the present disclosure, the protrusions include a pad metal bump on the pin of the filter chip and a mechanical support bump disposed on the side where the surface acoustic wave transmitting region is located.

In a possible implementation of the present disclosure, the step of forming a recessed cavity in the adhesive material includes:

forming, in the adhesive material, a recessed cavity corresponding to the position of the surface acoustic wave transmitting region, and at the same time forming, in the adhesive material, an interconnecting hole corresponding to the position of the chip pin bump or pad metal of the filter chip; and the step of adhering the filter chip to the first surface of the circuit substrate via the adhesive material includes:

adhering the filter chip to the first surface of the circuit substrate via the adhesive material, so that the interconnecting hole in the adhesive material communicates with the interconnecting hole in the circuit substrate to expose the chip pin bump or pad metal.

In a possible implementation of the present disclosure, after the step of encapsulating the filter chip with an encapsulating material, the method of forming an interconnecting hole extending from the circuit substrate to a chip pin pad/bump further comprises:

removing the adhesive material covering the interconnecting hole of the circuit substrate to expose a chip pin bump or pad metal of the filter chip through the interconnecting hole.

In a possible implementation of the present disclosure, before the step of filling the interconnecting hole with a conductive material, the method further comprises:

forming, by depositing, a seed metal layer on an inner wall of the interconnecting hole.

In a possible implementation of the present disclosure, the step of forming, on the second surface, an external pin pad electrically connected to the pin of the filter chip via the interconnecting hole includes:

forming an insulating layer on the circuit layer provided on the second surface;

partially removing the insulating layer to expose an external pin contact on the circuit layer provided on the second surface; and forming, on the external pin contact, an external pin pad electrically connected to the external pin contact.

Another object of the present disclosure is to provide a method of packaging a filter chip, the method comprising:

providing a circuit substrate, the circuit substrate comprising a first surface and a second surface remote from the first surface, wherein a circuit layer is pre-formed on the first surface, and a conductive layer covering the second surface is pre-formed on all regions of the second surface; and an interconnecting hole extending through the circuit substrate is pre-formed in the circuit substrate;

fabricating a filtering functional layer on the chip;

covering the first surface and/or the filter chip with an adhesive material and forming a recessed cavity or a closed cavity in the adhesive material;

adhering the filter chip to the first surface of the circuit substrate via the adhesive material, such that a surface acoustic wave transmitting region of the filter chip corresponds to the recessed cavity or closed cavity in the adhesive material to form a gap therebetween;

encapsulating the filter chip with an encapsulating material;

forming an interconnecting hole extending from the second surface to a pin of the filter chip to expose a chip pin bump or pad metal;

filling the interconnecting hole with a conductive material, so that the conductive material is in electrical contact with the chip pin bump or pad metal of the filter chip;

processing the conductive layer on the second surface to form a circuit layer; and forming, on the second surface, an external pin pad electrically connected to the chip pin bump or pad metal of the filter chip via the interconnecting hole.

In a possible implementation of the present disclosure, the step of covering the first surface and/or the filter chip with an adhesive material and forming a recessed cavity in the adhesive material includes:

covering the filter chip with an adhesive material; and partially removing the adhesive material at a position corresponding to the surface acoustic wave transmitting region to form a recessed cavity from which the surface acoustic wave transmitting region is exposed, so that a cavity wall at least partially surrounding the surface acoustic wave transmitting region is formed by the adhesive material.

In a possible implementation of the present disclosure, the step of covering the first surface and/or the filter chip with an adhesive material and forming a closed cavity in the adhesive material includes:

covering the filter chip with a first adhesive material;

partially removing the first adhesive material to form a recessed cavity corresponding to the surface acoustic wave transmitting region; and using a second adhesive material to close the recessed cavity, so that a closed cavity enclosing the surface acoustic wave transmitting region is formed by the first adhesive material together with the second adhesive material.

In a possible implementation of the present disclosure, the step of covering the first surface and/or the filter chip with an adhesive material and forming a recessed cavity in the adhesive material includes:

covering the first surface with an adhesive material; and partially removing the adhesive material to form a recessed cavity.

In a possible implementation of the present disclosure, the step of covering the first surface and/or the filter chip with an adhesive material and forming a recessed cavity in the adhesive material includes:

covering the first surface with an adhesive material and partially removing the adhesive material to form a recessed cavity; and the step of adhering the filter chip to the first surface of the circuit substrate via the adhesive material includes:

adhering, onto the adhesive material, the filter chip having protrusions on a side where the surface acoustic wave transmitting region is located, so that the surface acoustic wave transmitting region corresponds to the recessed cavity in the adhesive material to form a gap therebetween.

In a possible implementation of the present disclosure, the protrusions include a pad metal bump on the pin of the filter chip and a mechanical support bump disposed on the side where the surface acoustic wave transmitting region is located.

In a possible implementation of the present disclosure, the step of forming a recessed cavity in the adhesive material includes:

forming, in the adhesive material, a recessed cavity corresponding to the position of the surface acoustic wave transmitting region, and at the same time forming, in the adhesive material, an interconnecting hole corresponding to the position of the chip pin bump or pad metal of the filter chip;

the step of adhering the filter chip to the first surface of the circuit substrate via the adhesive material includes:

adhering the filter chip to the first surface of the circuit substrate via the adhesive material, so that the interconnecting hole in the adhesive material communicates with the interconnecting hole in the circuit substrate to expose the chip pin bump or pad metal.

In a possible implementation of the present disclosure, after the step of encapsulating the filter chip with an encapsulating material, the method of forming an interconnecting hole extending from the circuit substrate to a chip pin pad/bump further comprises:

removing the adhesive material covering the interconnecting hole of the circuit substrate to expose a chip pin bump or pad metal of the filter chip through the interconnecting hole.

In a possible implementation of the present disclosure, before the step of filling the interconnecting hole with a conductive material, the method further comprises:

forming, by depositing, a seed metal layer on an inner wall of the interconnecting hole.

In a possible implementation of the present disclosure, the step of forming, on the second surface, an external pin pad electrically connected to the pin of the filter chip via the interconnecting hole includes:

forming an insulating layer on the circuit layer provided on the second surface;

partially removing the insulating layer to expose an external pin contact on the circuit layer provided on the second surface; and forming, on the external pin contact, an external pin pad electrically connected to the external pin contact.

A further object of the present disclosure is to provide a package structure for the filter chip, the package structure for the filter chip comprising:

a circuit substrate, comprising a first surface and a second surface remote from the first surface, wherein the circuit substrate is provided with an interconnecting hole extending from the second surface to the first surface, and the interconnecting hole is filled with a conductive material;

a filter chip, having a support structure on its side facing the circuit substrate, wherein the support structure forms a cavity wall at least partially surrounding the surface acoustic wave transmitting region, and the support structure allows a gap corresponding to the position of the surface acoustic wave transmitting region to be formed between the chip to be packaged and the circuit substrate; a chip pin bump or a pad metal of the filter chip corresponds to the position of the interconnecting hole and is in electrical contact with the conductive material in the interconnecting hole;

an encapsulating material, enclosing the filter chip; and an external pin pad, disposed on the second surface and electrically connected to a pin of the filter chip via the interconnecting hole.

In a possible implementation of the present disclosure, the support structure includes pad metal bumps formed on the pin of the chip to be packaged and/or mechanical support bumps at least partially arranged around the surface acoustic wave transmitting region; and the filter chip is adhered on the first surface of the circuit substrate via an adhesive material.

In a possible implementation of the present disclosure, the adhesive material is provided with a recess at a position corresponding to the acoustic wave transmitting region.

In a possible implementation of the present disclosure, the support structure includes a cavity wall at least partially surrounding the surface acoustic wave transmitting region that is formed by an adhesive material; and the filter chip is adhered on the first surface of the circuit substrate via the adhesive material.

In a possible implementation of the present disclosure, an area on the first surface onto which the first adhesive material and/or the second adhesive layer is projected is smaller than an area on the first surface onto which the filter chip is projected, and the area on the first surface onto which the filter chip is projected is smaller than an area on the first surface onto which a sheet of the encapsulating material is projected.

Compared with the prior art, the present disclosure has the following advantageous effects:

In the packaging method and package structure for a filter chip according to the embodiments of the present disclosure, a filter chip is adhered to a first surface of the circuit substrate by using an adhesive material, so that there is a certain gap between the surface acoustic wave transmitting region of the filter chip and the adhesive material or the first surface, whereby a cavity is formed between the filter chip and the circuit substrate after the filter chip is enclosed with an encapsulating material. Moreover, a pin of the filter chip is electrically connected to an external bump on the second surface of the circuit substrate through an interconnecting hole extending through the circuit substrate. In this way, it is unnecessary to form, by grinding, a cavity in the circuit substrate so that the packaging difficulty is reduced, and the wire bonding process or the gold ball flip-chip bonding process is not used so that the package structure for a filter can have a smaller and thinner size.

BRIEF DESCRIPTION OF DRAWINGS

In order to more clearly illustrate technical solutions of embodiments of the present disclosure, drawings required for use in the embodiments will be described briefly below. It should be understood that the drawings below are merely illustrative of some embodiments of the present disclosure, and therefore should not be considered as limiting its scope. It will be understood by those of ordinary skill in the art that other relevant drawings can also be obtained from these drawings without any inventive effort.

Figure 1:
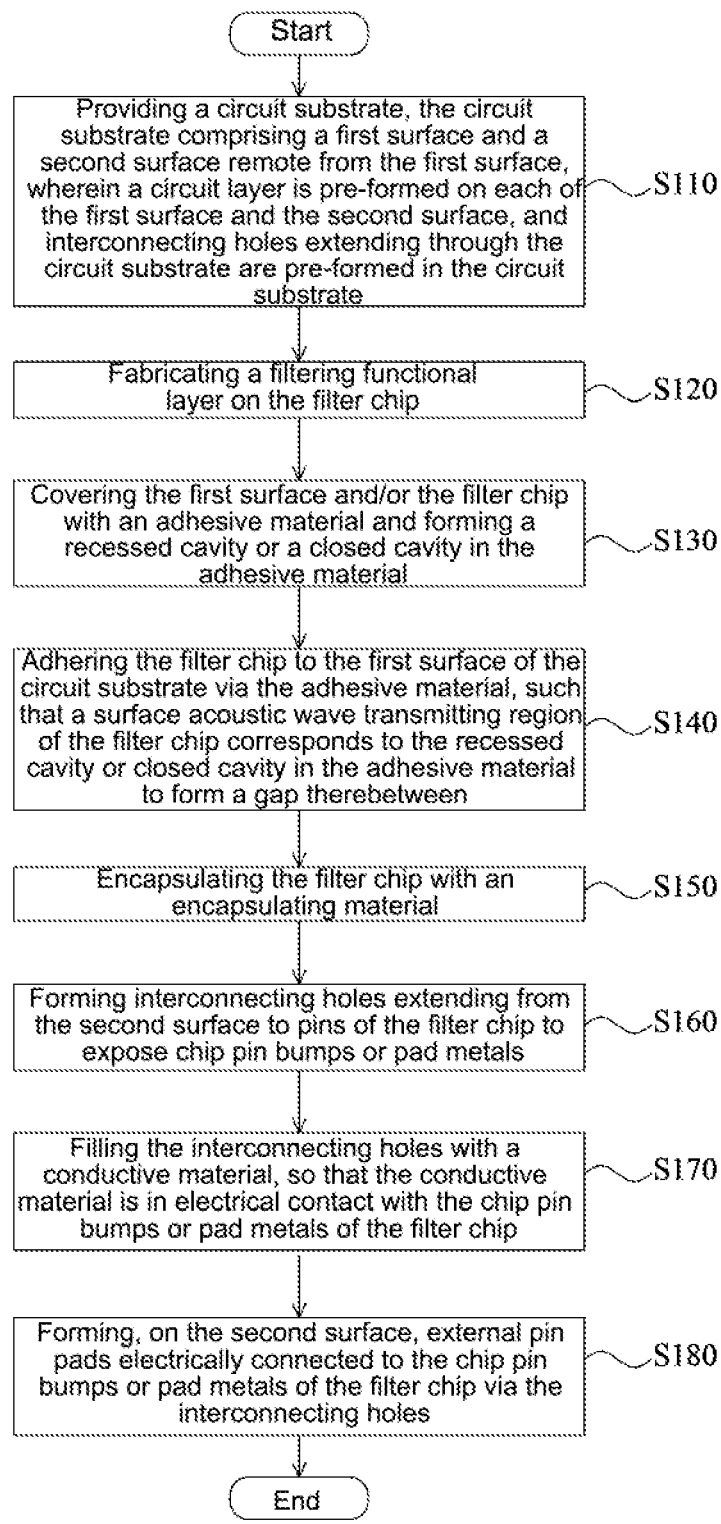
FIG. 1 is a schematic flowchart of a method of packaging a filter chip according to an embodiment of the present disclosure.

Reference Signs: 100—circuit substrate; 103—first circuit layer; 102—second circuit layer; 104—interconnecting hole; 200—adhesive material; 300—filter chip; 301—mechanical support bump; 302—pad metal bump; 500—encapsulating material; 600—conductive material; 700—conductive layer; 800—insulating layer; 900—external pin pad.

DETAILED DESCRIPTION

In order to further clarify the objects, technical solutions, and advantages of the embodiments of the present disclosure, the technical solutions of the embodiments of the present disclosure will be described below clearly and completely with reference to the drawings of the embodiments of the present disclosure. It is apparent that the embodiments to be described are some, but not all of the embodiments of the present disclosure. Generally, the components of the embodiments of the present disclosure, as described and illustrated in the drawings herein, may be arranged and designed in a wide variety of different configurations.

Thus, the following detailed description of the embodiments of the present disclosure, as represented in the drawings, is not intended to limit the scope of the present disclosure as claimed, but is merely representative of selected embodiments of the present disclosure. All the other embodiments obtained by those of ordinary skill in the art in light of the embodiments of the present disclosure without inventive efforts will fall within the scope of the present disclosure as claimed.

It should be noted that similar reference signs and letters refer to similar items in the following drawings, and thus once a certain item is defined in one figure, it may not be further defined or explained in the following figures.

In the description of the present disclosure, it should be noted that orientation or positional relationships indicated by the terms such as "center", "up", "down", "left", "right", "vertical", "horizontal", "inside", and "outside" are the orientation or positional relationships shown based on the drawings, or the orientation or positional relationships in which the inventive product is conventionally placed in use, and these terms are intended only to facilitate the description of the present disclosure and simplify the description, but not intended to indicate or imply that the referred devices or elements must be in a particular orientation or constructed or operated in the particular orientation, and therefore should not be construed as limiting the present disclosure. In addition, terms such as "first", "second", and "third" are used for distinguishing the description only, and should not be understood as an indication or implication of relative importance.

In the description of the present disclosure, it should also be noted that terms "dispose", "mount", "couple", and "connect" should be understood broadly unless otherwise expressly specified or defined. For example, connection may be fixed connection or detachable connection or integral connection, may be mechanical connection or electric connection, or may be direct coupling or indirect coupling via an intermediate medium or internal communication between two elements. The specific meanings of the above-mentioned terms in the present disclosure can be understood by those of ordinary skill in the art according to specific situations.

Referring to FIG. 1, FIG. 1 is a schematic flowchart of a method of packaging a filter chip 300 according to this embodiment. Each of steps of the method will be explained in detail below.

In step S110, a circuit substrate 100 is provided, the circuit substrate 100 comprising a first surface and a second surface remote from the first surface. A circuit layer is pre-formed on each of the first surface and the second surface, and interconnecting holes 104 extending through the circuit substrate 100 are pre-formed in the circuit substrate 100.

Figure 2:
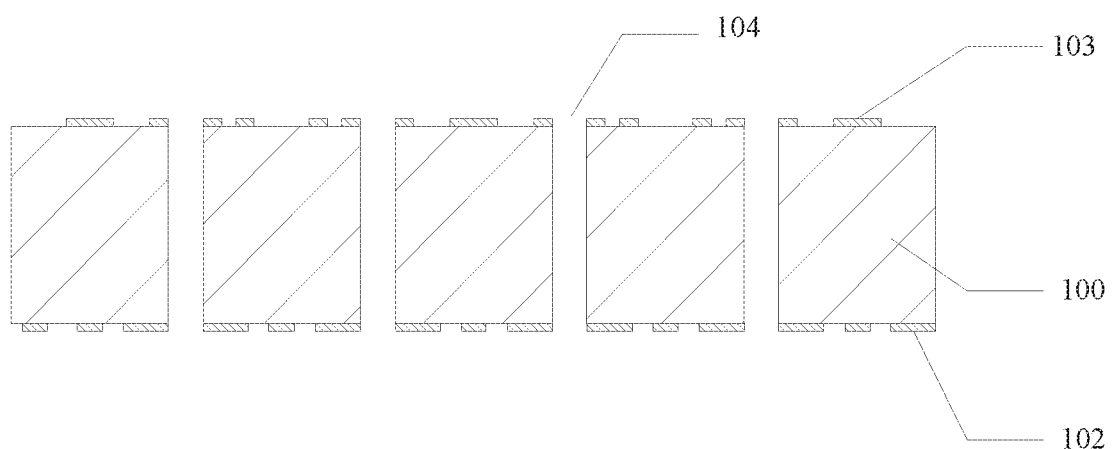
FIGS. 2-8 are schematic flowcharts of procedures for manufacturing a package structure for filter chip according to an embodiment of the present disclosure.

Referring to FIG. 2, a first circuit layer 103 may be pre-formed on the first surface of the circuit substrate 100, and a second circuit layer 102 may be formed on the second surface of the circuit substrate 100.

The circuit substrate 100 may be a printed circuit board (PCB), a flexible printed circuit board (FPCB), or a double-sided copper clad laminate manufactured based on an organic, inorganic, metal, or other material such as a liquid crystal polymer (LCP), ceramic, glass, metal, or silicon.

Interconnecting holes 104 may be further pre-formed in the circuit substrate 100. The positions of the interconnecting holes 104 correspond to the positions of chip pin bumps or pad metals of the filter chip 300 after the filter chip 300 is adhered on the circuit substrate 100.

In step S120, a filtering functional layer is fabricated on the filter chip 300.

In this embodiment, the filter chip 300 may be a surface acoustic wave filter chip 300, and the filtering functional layer may include surface acoustic wave transmitting regions.

In step S130, the first surface of the circuit substrate 100 and/or the filter chip 300 is covered with an adhesive material 200, and recessed cavities or closed cavities is formed in the adhesive material 200.

In step S140, the filter chip 300 is adhered to the first surface of the circuit substrate 100 via the adhesive material 200, such that the surface acoustic wave transmitting region of the filter chip 300 corresponds to the recessed cavity or closed cavity in the adhesive material 200 to form a gap therebetween.

In this embodiment, a recessed cavity or a closed cavity may be formed in the adhesive material 200. Here, the recessed cavity or the closed cavity may be formed in the adhesive material 200 by using, but not limited to, a photoetching process. The adhesive material 200 may be a die attach film (DAF), or a uniformly coatable liquid material (which may be a photosensitive material or not a photosensitive material).

Moreover, in this embodiment, one or more filter chips 300 are adhered on the adhesive material 200 at one time by the step S130 and the step S140.

Figures 1, 3:
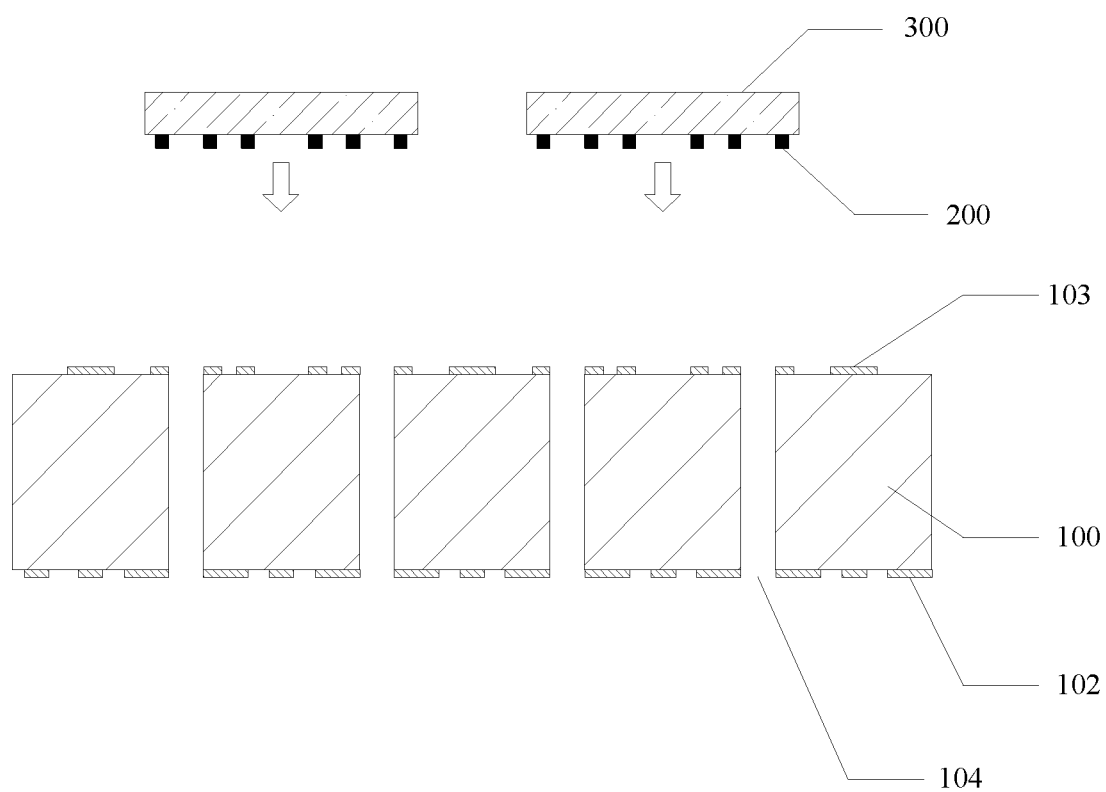
Figures 2, 3:
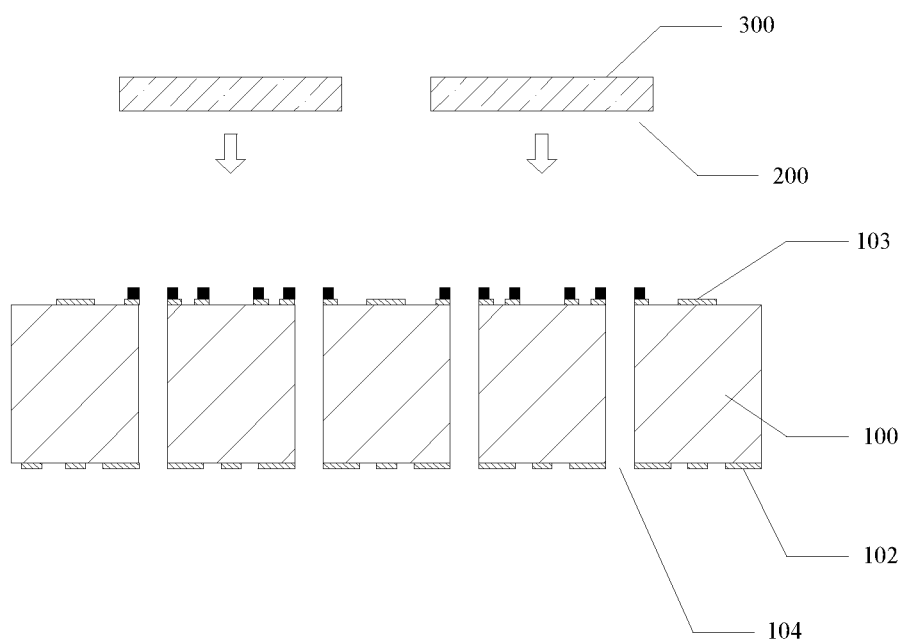
Figure 3:
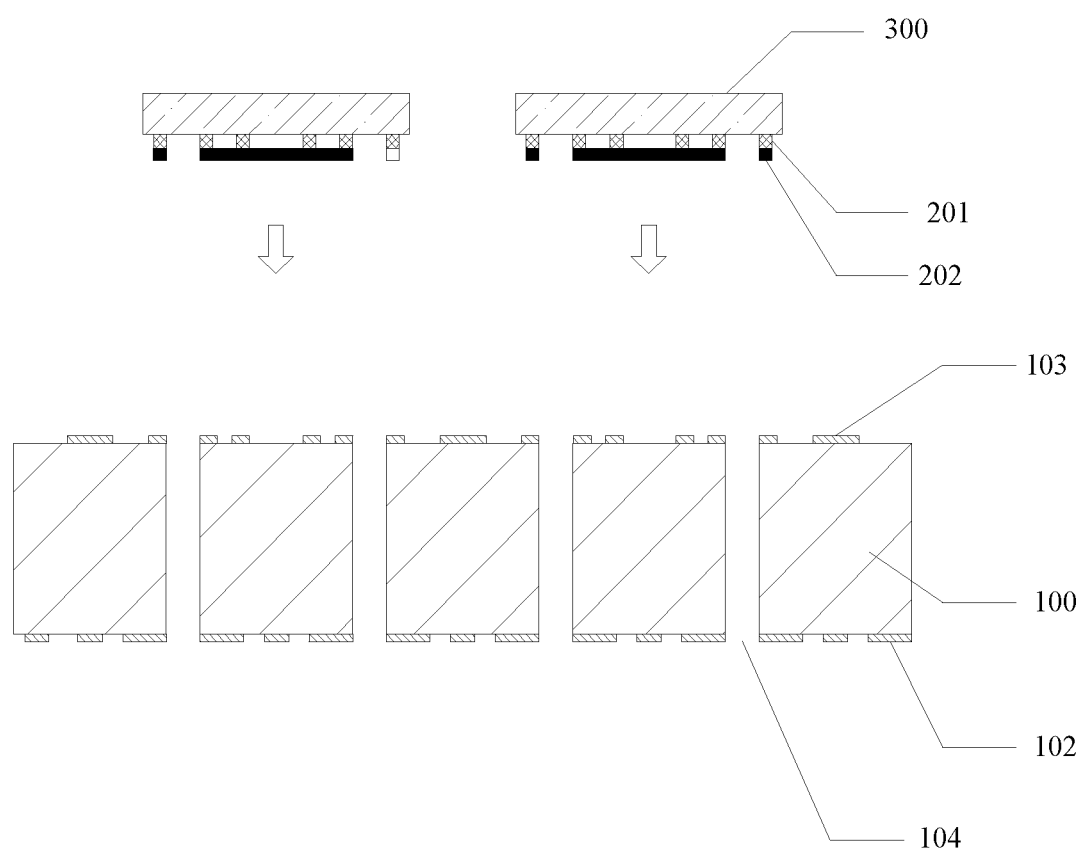

Optionally, in an implementation of this embodiment, referring to FIG. 3-1, in the step S130, the filter chip 300 may be first covered with an adhesive material 200, and then the adhesive material 200 is partially removed at a position corresponding to the surface acoustic wave transmitting region to form a recessed cavity from which the surface acoustic wave transmitting region is exposed, so that the adhesive material 200 forms a cavity wall at least partially surrounding the surface acoustic wave transmitting region.

Figures 3, 4:
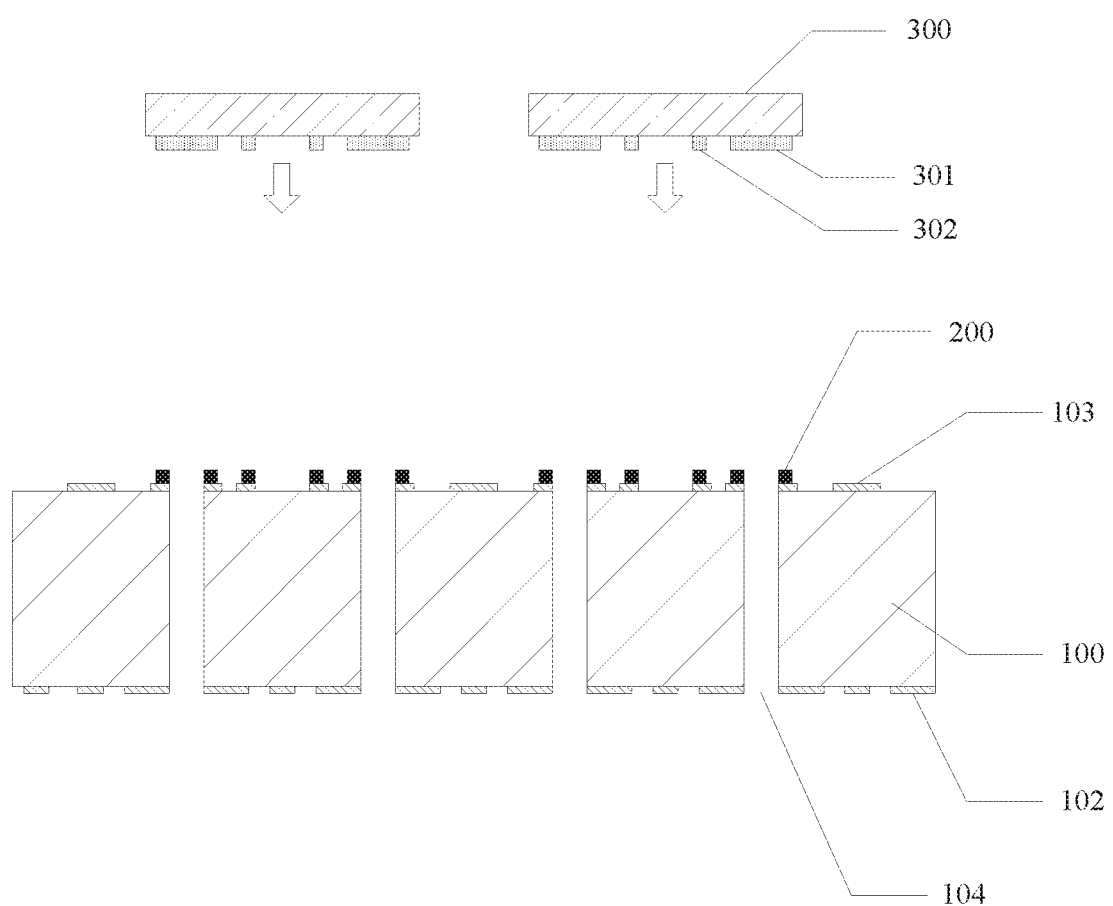
Figures 1, 4:
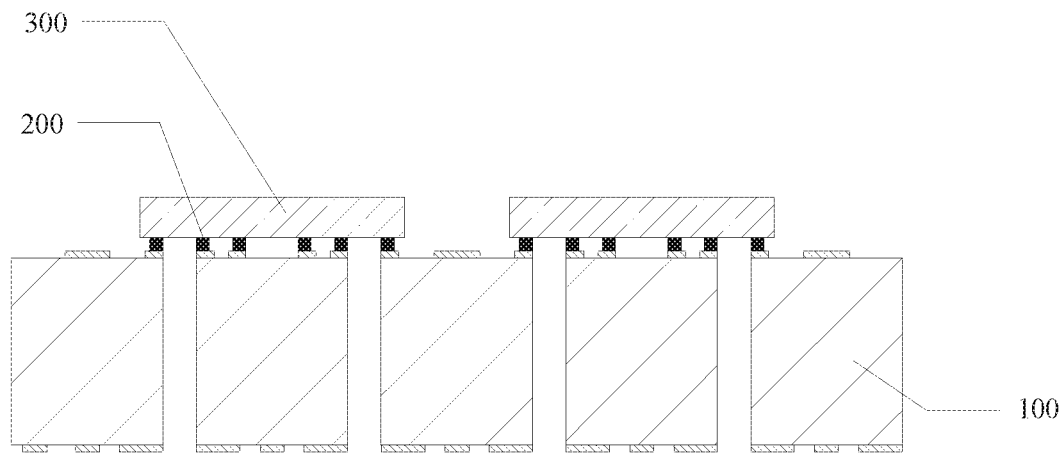
Figures 2, 4:
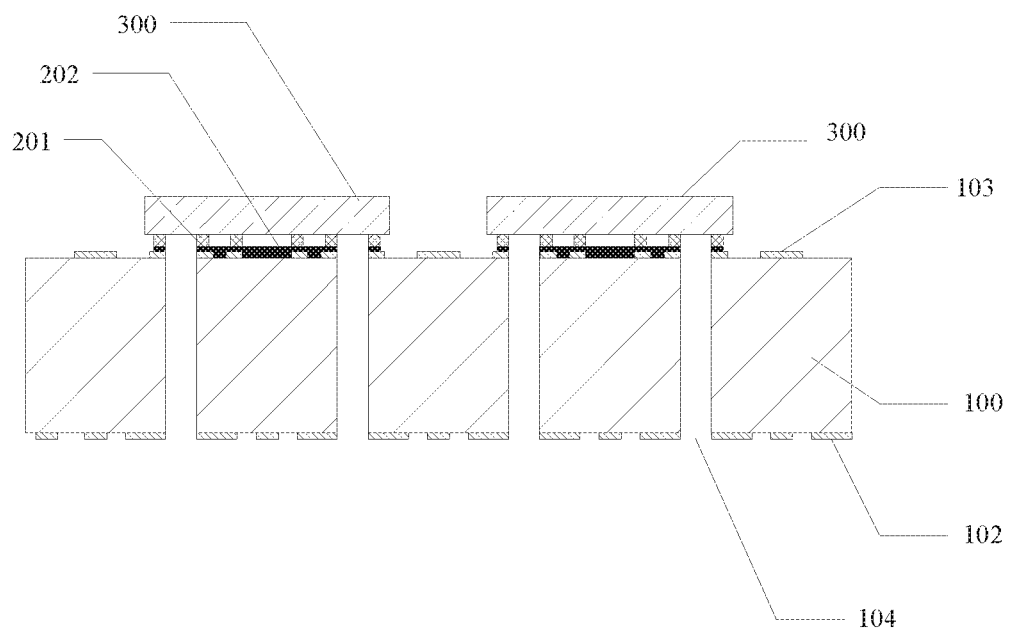
Figures 3, 4:
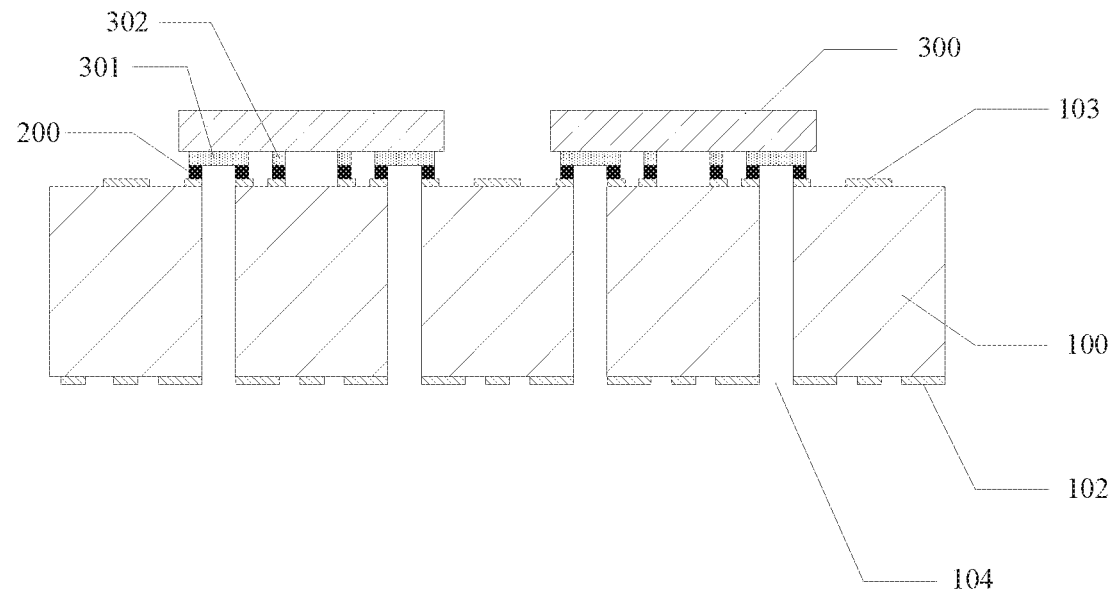

In the step S140, the filter chip 300 is adhered to the first surface of the circuit substrate 100, and a cavity accommodating the surface acoustic wave transmitting region is formed by the cavity wall together with the first surface of the circuit substrate 100, as shown in FIG. 4-1.

Optionally, in another implementation of this embodiment, referring to FIG. 3-2, in the step S130, the first surface may be first covered with an adhesive material 200, and then the adhesive material 200 is partially removed to form recessed cavities.

In the step S140, the surface acoustic wave transmitting region of the filter chip 300 is aligned with the recessed cavity and then adhered to the adhesive material 200, so that a cavity accommodating the surface acoustic wave transmitting region is formed by the adhesive material 200 together with the first surface of the circuit substrate 100, as shown in FIG. 4-1.

Optionally, in another implementation of this embodiment, referring to FIG. 3-3, in the step S130, the chip may be first covered with a first adhesive material 200, and then the first adhesive material 200 is partially removed to form a recessed cavity corresponding to the surface acoustic wave transmitting region, and then the recessed cavity is closed with a second adhesive material 200 so that a closed cavity enclosing the surface acoustic wave transmitting region is formed by the first adhesive material 200 together with the second adhesive material 200, as shown in FIG. 4-2.

Here, the first adhesive material 200 may be the same as the second adhesive material 200, or the first adhesive material 200 may be different from the second adhesive material 200.

Optionally, in another implementation of this embodiment, referring to FIG. 3-4, in S130, the first surface may be covered with an adhesive material 200, and the adhesive material 200 is partially removed to form recessed cavities. In the step S140, the filter chip 300 having protrusions on a side where the surface acoustic wave transmitting regions are located may be adhered on the adhesive material 200, so that the surface acoustic wave transmitting region corresponds to the recessed cavity in the adhesive material 200 to form a gap therebetween, as shown in FIG. 4-3.

The protrusions may include pad metal bumps 302 on pins of the filter chip 300 and mechanical support bumps 301 disposed on a side where the surface acoustic wave transmitting region is located. Here, the protrusions include pad metal bumps 302 on pins of the filter chip 300 and mechanical support bumps 301 disposed on a side where the surface acoustic wave transmitting regions are located. The size of the mechanical support bump 301 may be smaller than, equal to, or larger than the pin pad bump.

If the filter chip 300 has the mechanical support bumps 301, the mechanical support bumps 301 may be independently dispersed on the side where the surface acoustic wave transmitting region is located so as to prevent the surface of the surface acoustic wave transmitting region from being in contact with the surface of the circuit substrate 100. The mechanical support bump 301 may also be a thin metal wire continuously arranged around the filter chip 300 to prevent entry of an encapsulating material 500 into the cavity.

The mechanical support bump 301 and the pad metal bump 302 may be made of one or, an alloy of more than one, of copper, nickel, gold, aluminum, tin, tin alloy (such as tin-silver-copper, tin-silver alloy, or the like), etc. For example, in this embodiment, a copper/tin-silver alloy is used as the pad metal bump 302 and the mechanical support bump 301 instead of gold bumps, whereby the cost can be significantly reduced.

In this way, a cavity required for the surface acoustic wave transmitting region of the filter chip 300 can be formed without forming, by grinding, a recessed structure in the circuit substrate 100 in advance, whereby the process difficulty is reduced and the package structure for the filter chip 300 can have a smaller and thinner size. The packaging method according to this embodiment allows the package thickness to be reduced by 0.2 to 0.3 mm as compared with the conventional packaging process.

In step S150, the filter chip 300 is encapsulated with an encapsulating material 500.

Figure 5:
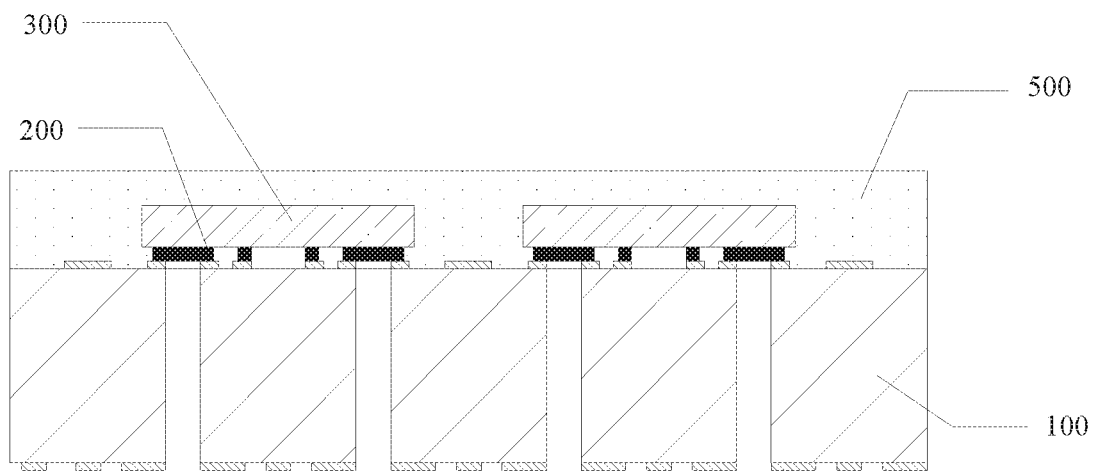

In this embodiment, referring to FIG. 5, after the encapsulating material 500 is disposed, an area on the first surface onto which the filter chip 300 is projected is smaller than an area on the first surface onto which a sheet of the encapsulating material 500 is projected.

In some implementations of this embodiment, an area on the first surface onto which the adhesive material 200 is projected is smaller than an area on the first surface onto which the filter chip 300 is projected, and the area on the first surface onto which the filter chip 300 is projected is smaller than an area on the first surface onto which a sheet of the encapsulating material 500 is projected. In this way, the requirement for protection of the chip from water vapor can be met only by means of the encapsulation material 500, and the requirement for the waterproof performance of the adhesive material 200 can be reduced.

In step S160, interconnecting holes 104 extending from the second surface to pins of the filter chip 300 are formed to expose chip pin bumps or pad metals.

Optionally, in an implementation of this embodiment, in the step S130, recessed cavities corresponding to the positions of the surface acoustic wave transmitting regions are formed in the adhesive material 200, and at the same time interconnecting holes 104 corresponding to the positions of the chip pin bumps or pad metals of the filter chip 300 can be formed in the adhesive material 200 by a process such as dry/wet etching, laser drilling, or the like, as shown in FIGS. 3-1 to 3-4.

In the step S140, the filter chip 300 is adhered to the first surface of the circuit substrate 100 via the adhesive material 200, so that the interconnecting holes 104 in the adhesive material 200 communicate with the interconnecting holes 104 in the circuit substrate 100 to expose the chip pin bumps or pad metals. Thereby, interconnecting holes 104 extending from the second surface to the pins of the filter chip 300 are obtained and formed directly in step S160.

Figures 1, 6:
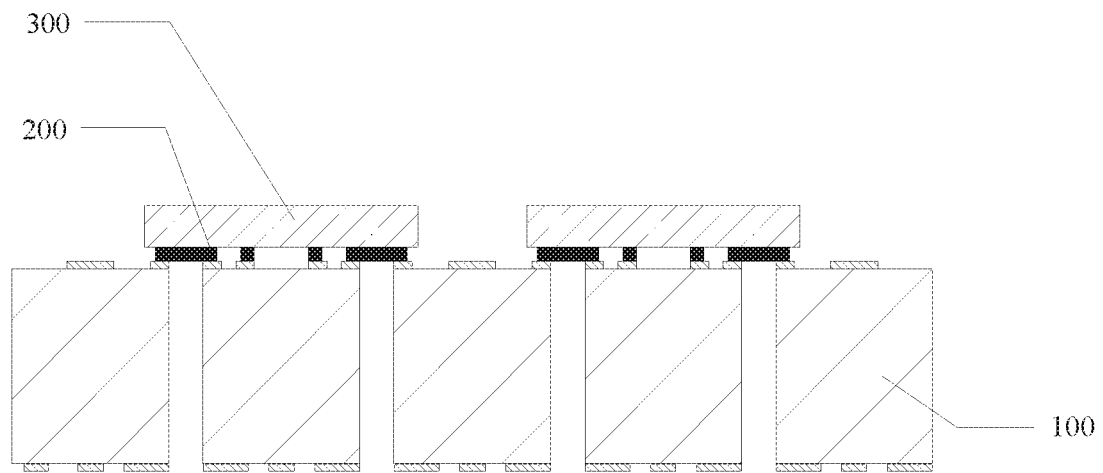
Figures 2, 6:
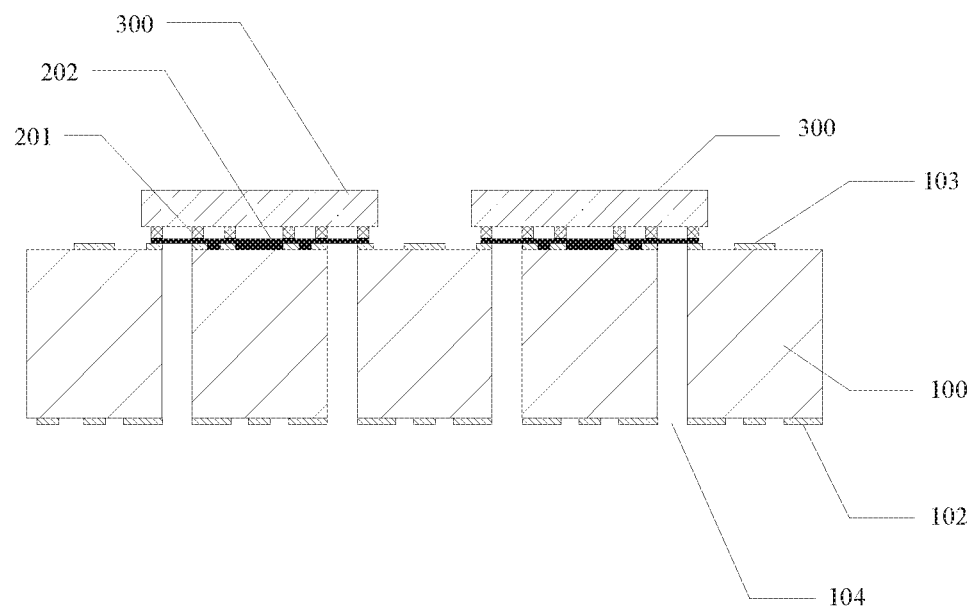
Figures 3, 6:
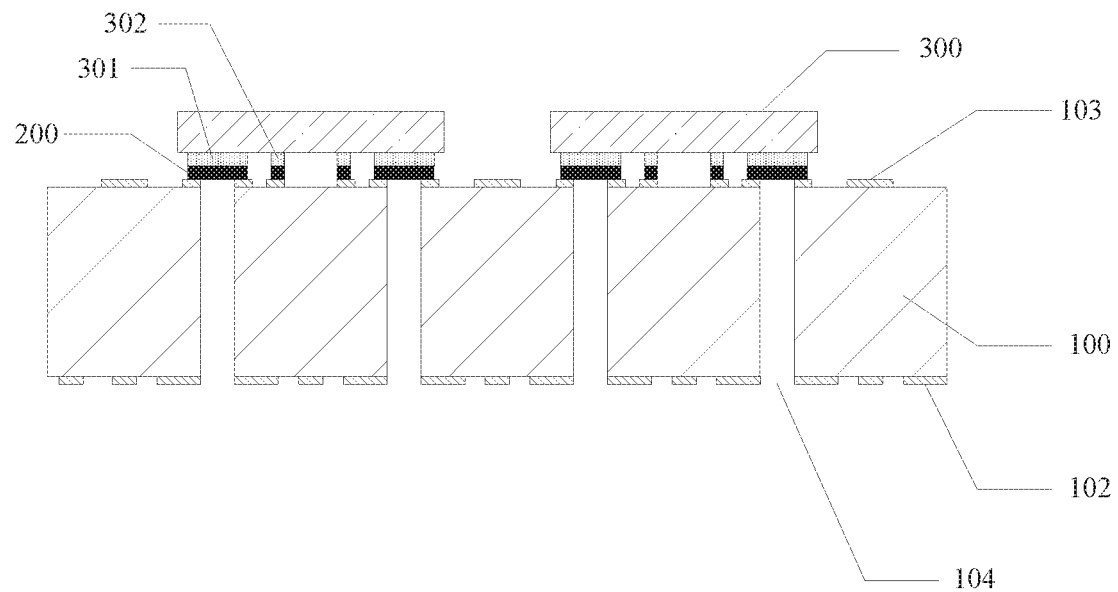

Optionally, in another implementation of this embodiment, through holes may not be formed in the adhesive material 200 in the step S130, as shown in FIGS. 6-1 to 6-3. Then, in the step S160, the adhesive material 200 covering the interconnecting holes 104 of the circuit substrate 100 is removed to form the interconnecting holes 104 extending from the second surface to pins of the filter chip 300, so that a chip pin bumps or pad metals of the filter chip 300 are exposed through the interconnecting holes 104.

Here, the interconnecting hole 104 extending from the second surface to a pin of the filter chip 300 may be formed directly by dry etching, wet etching, laser drilling, mechanical drilling, or the like.

In step S170, the interconnecting holes 104 are filled with a conductive material 600, so that the conductive material 600 is in electrical contact with the chip pin bumps or pad metals of the filter chip 300.

Figure 7:
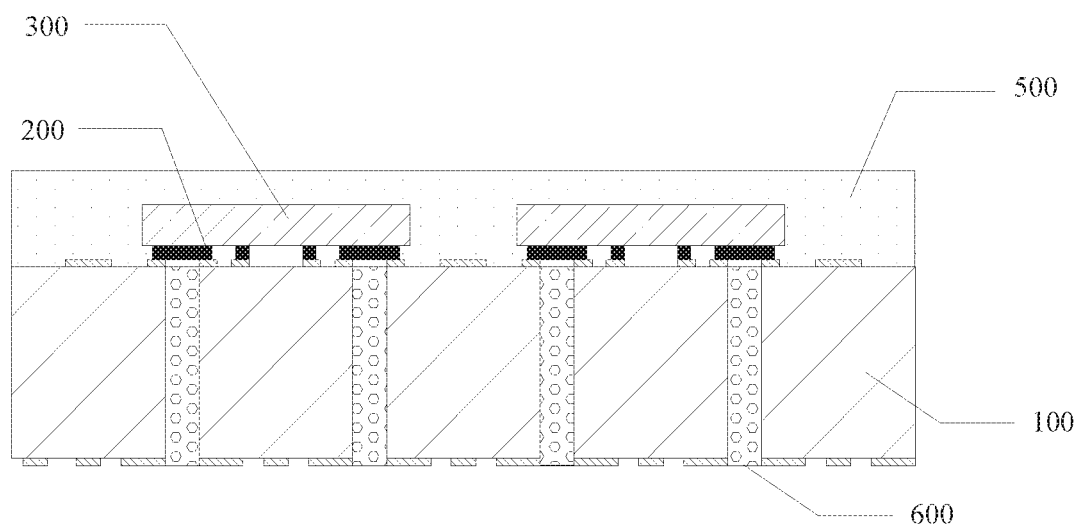

Optionally, referring to FIG. 7, in this embodiment, before the step S170, a seed metal layer may be first deposited and formed in an inner wall of the interconnecting hole 104 by using a process such as physical vapor deposition (PVD), chemical vapor deposition (CVD), electroless plating, or the like. The seed metal layer may be made of copper.

Then, the interconnecting hole 104 is filled with the conductive material 600 by a process such as electroless plating, electroplating, or high-pressure injection, or a combination of these processes. In this way, the conductive material 600 can be more stably disposed in the interconnecting hole 104.

Here, the conductive material 600 may be a metal or an alloy (alloy solder) selected from gold, copper, tin, silver, indium, titanium, tungsten, and the like, or may be a material such as a conductive silver paste, a conductive polymer, or the like.

In step S180, external pin pads 900 electrically connected to the chip pin bumps or pad metals of the filter chip 300 via the interconnecting holes 104 are formed on the second surface.

Figure 8:
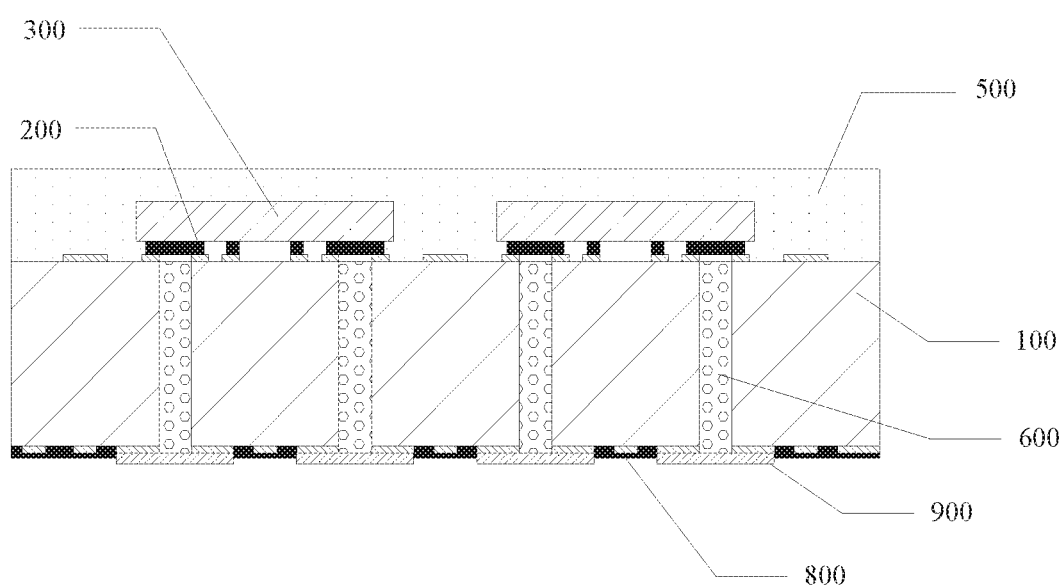

Referring to FIG. 8, in this embodiment, an insulating layer 800 may be formed on the circuit layer provided on the second surface. Then, the insulating layer 800 is partially removed by using a process such as photoetching, laser drilling, or dry etching/wet etching to expose external pin contacts on the circuit layer provided on the second surface.

Then, external pin pads 900 electrically connected to the external pin contacts are formed on the external pin contacts by using a process such as electroless nickel/gold plating.

After the above steps are completed, a plurality of the packaged filter chips 300 may be cut to obtain a single filter chip 300.

Figure 9:
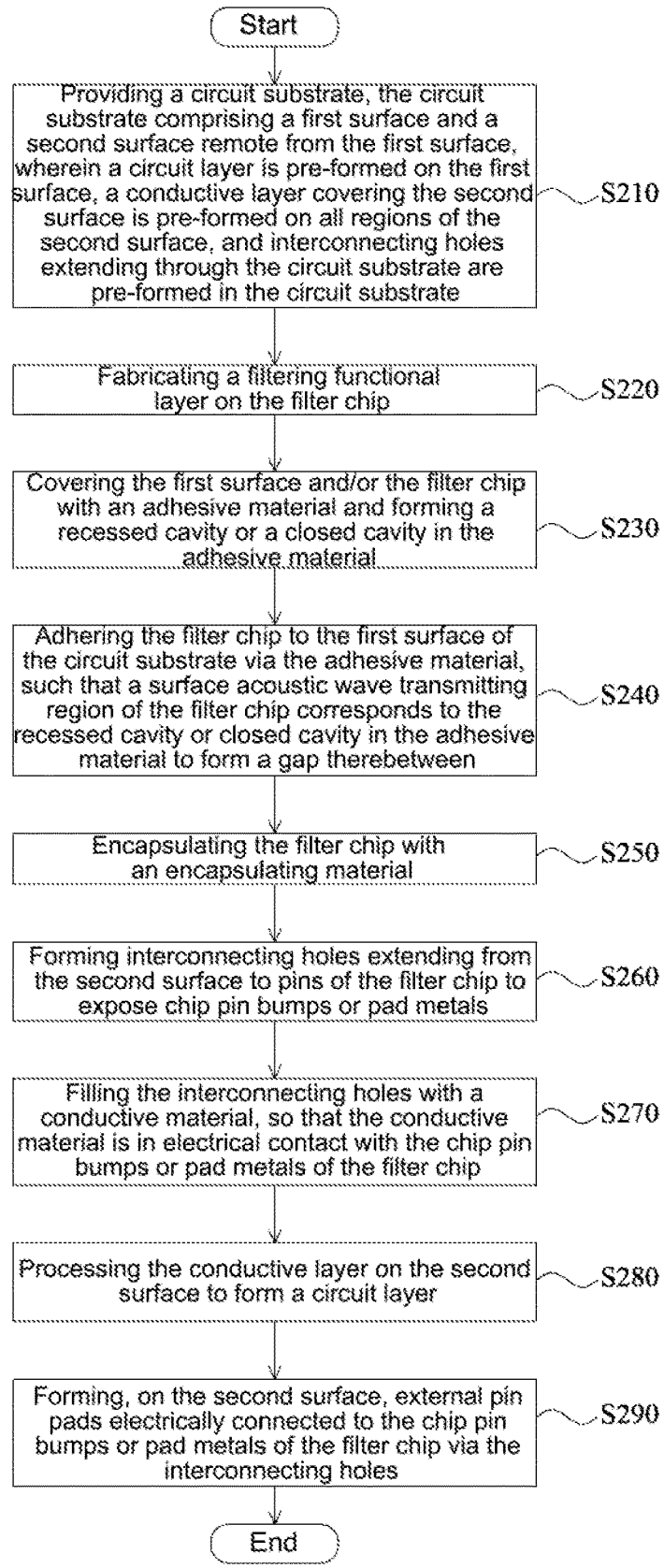
FIG. 9 is a schematic flowchart of another method of packaging a filter chip according to an embodiment of the present disclosure.

Referring to FIG. 9, FIG. 9 is a schematic flowchart of another method of packaging a filter chip 300 according to this embodiment. The method may comprise the following steps.

In step S210, a circuit substrate 100 is provided, the circuit substrate 100 comprising a first surface and a second surface remote from the first surface. A circuit layer is pre-formed on the first surface, and a conductive layer 700 covering the second surface is pre-formed on all regions of the second surface. Interconnecting holes 104 extending through the circuit substrate 100 are pre-formed in the circuit substrate 100.

Figure 10:
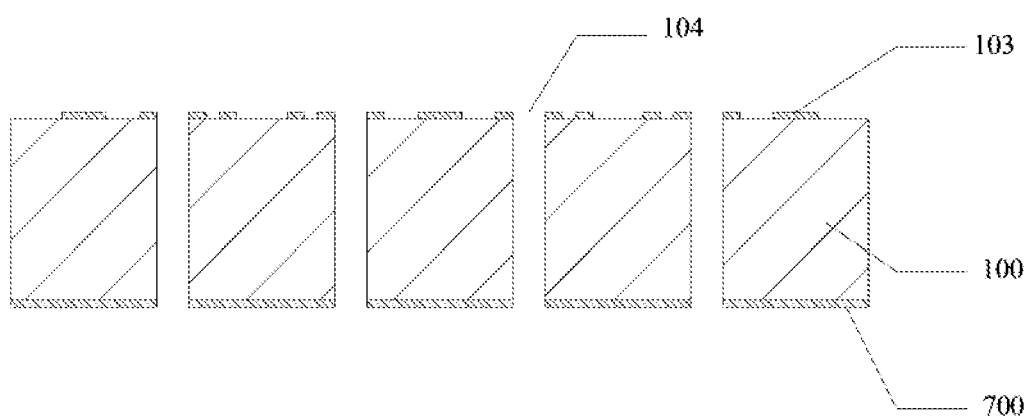
FIG. 10 is a schematic view of a conductive layer according to an embodiment of the present disclosure.

Referring to FIG. 10, unlike the step S110 in the method shown in FIG. 2, on the circuit substrate 100 provided in the step S210, a circuit layer is not pre-formed on the second surface, but the second surface is covered with a complete conductive layer 700, wherein the conductive layer 700 may be made of copper.

In step S220, a filtering functional layer is fabricated on the chip.

In step S230, the first surface and/or the filter chip 300 is covered with an adhesive material 200, and recessed cavities or a closed cavities is formed in the adhesive material 200.

In step S240, the filter chip 300 is adhered to the first surface of the circuit substrate 100 via the adhesive material 200, such that a surface acoustic wave transmitting region of the filter chip 300 corresponds to the recessed cavity or closed cavity in the adhesive material 200 to form a gap therebetween.

In step S250, the filter chip 300 is encapsulated with an encapsulating material 500.

In step S260, interconnecting holes 104 extending from the second surface to pins of the filter chip 300 are formed to expose chip pin bumps or pad metals.

In step S270, the interconnecting holes 104 are filled with a conductive material 600, so that the conductive material 600 is in electrical contact with the chip pin bump or pad metal of the filter chip 300.

In this embodiment, the detailed implementation of the steps S220 to S270 can be understood with reference to the related explanations of the steps S120 to S170 shown in FIG. 2, and therefore will not be described repeatedly herein.

In step S280, the conductive layer 700 on the second surface is processed to form a circuit layer.

In this embodiment, unlike the method shown in FIG. 2, a second circuit layer 102 is not formed on the second surface, thus the conductive layer 700 may be etched by a photoetching process or a wet etching process (or an electroplating process) after the step S270 to remove an unnecessary portion from the conductive layer such that the second circuit layer 102 is formed.

In step S290, external pin pads 900 electrically connected to the chip pin bumps or pad metals of the filter chip 300 via the interconnecting holes 104 are formed on the second surface.

In this embodiment, the detailed implementation of the step S290 can be understood with reference to the related explanation of the step S180 shown in FIG. 2, and therefore will not be described repeatedly herein.

This embodiment also provides a package structure for a filter chip 300. The package structure for a filter chip 300 may comprise:

a circuit substrate 100, the circuit substrate 100 comprising a first surface and a second surface remote from the first surface, wherein the circuit substrate 100 is provided with the interconnecting holes 104 extending from the second surface to the first surface, and the interconnecting hole 104 is filled with a conductive material 600;

a filter chip 300, the filter chip 300 having support structures on its side facing the circuit substrate 100, wherein the support structure forms a cavity wall at least partially surrounding the surface acoustic wave transmitting region, and the support structure allows a gap corresponding to the position of the surface acoustic wave transmitting region to be formed between the chip to be packaged and the circuit substrate 100; a chip pin bump or a pad metal of the filter chip 300 corresponds to the position of the interconnecting hole 104 and is in electrical contact with the conductive material 600 in the interconnecting hole 104;

an encapsulating material 500, the encapsulating material 500 enclosing the filter chip 300; and an external pin pad 900, the external pin pad 900 being disposed on the second surface and electrically connected to a pin of the filter chip 300 through the interconnecting hole 104.

Optionally, the support structure includes pad metal bumps 302 formed on the pins of the chip to be packaged and/or mechanical support bumps 301 at least partially arranged around the surface acoustic wave transmitting region. The filter chip 300 is adhered on the first surface of the circuit substrate 100 via an adhesive material 200.

Optionally, the adhesive material 200 has recesses at positions corresponding to the acoustic wave transmitting regions.

Optionally, the support structure includes a cavity wall at least partially surrounding the surface acoustic wave transmitting region that is formed by an adhesive material 200; and the filter chip 300 is adhered on the first surface of the circuit substrate 100 via the adhesive material 200.

Optionally, an area on the first surface onto which the adhesive material 200 is projected is smaller than an area on the first surface onto which the filter chip 300 is projected, and the area on the first surface onto which the filter chip 300 is projected is smaller than an area on the first surface onto which a sheet of the encapsulating material 500 is projected.

The manufacture of the package structure for a filter chip 300 may be carried out with reference to the method shown in FIG. 1 or FIG. 2 of this embodiment, and therefore will not be described repeatedly herein.

In summary, the solutions proposed in the embodiments of the present disclosure can have the following advantageous effects:

1. It is unnecessary to form, by grinding, a cavity in the circuit substrate so that the packaging difficulty is reduced, and the wire bonding process or the gold ball flip-chip bonding process is not used so that the package structure for a filter can have a smaller and thinner size; and wire bonding procedures of the conventional packaging process, or gold ball bump fabrication and ultrasonic flip-chip bonding procedures are reduced, which contributes to increased yield, increased productivity, and reduced cost.

2. The manufacture of the filter chip package substrate and the packaging of the filter chip are completed at the same time, which contributes to the selection of the package substrate material and contributes to an optimized package design. For example, circuit substrate materials having better high-frequency characteristics than ceramic substrates can be selected to optimize the filtering performance of surface acoustic wave filter chips, whereby frequency and power characteristics can be significantly improved.

3. The electrical and mechanical interconnections between the filter chip and the circuit layer of the circuit substrate are achieved by a single metal material (such as electroplated copper) which has good conductivity, thereby avoiding the problem of unreliability under long-term use due to bonded interfaces between different metals used in the conventional packaging process and improving the reliability of the surface acoustic wave filter device.

4. Compared with the wire bonding or chip golden ball fabrication/gold ball flip-chip bonding process used in the conventional packaging process in which only a single surface acoustic wave filter chip can be interconnected to the substrate at one time, the packaging method proposed in the present disclosure allows electrical interconnection of a huge number of surface acoustic wave filter chips at one time, and thus the time required for interconnecting the chip can be shortened by several times to dozens of times from 0.5-0.8 seconds in the conventional process.

5. The manufacture of the filter chip package substrate and the packaging of the filter chip are completed at the same time, which contributes to quality control and reduction of the processing cost of the package substrate.

It should be noted that in this text, relationship terms such as first, second, and the like are used only for distinguishing one entity or operation from another entity or operation, while it is not necessarily required or implied that these entities or operations have any such practical relationship or order. Furthermore, the terms "comprise", "include", or any other variations thereof are intended to cover non-exclusive inclusions, such that a process, method, article, or apparatus that comprises a list of elements not only comprises those elements, but also comprises other elements not expressly listed or also comprises elements inherent to such process, method, article, or apparatus. Without more restrictions, an element defined with the wording "comprising a . . . " does not exclude the presence of additional identical elements in the process, method, article or apparatus comprising said element.

The above description is merely illustrative of various embodiments of the present disclosure, but the scope of protection of the present disclosure is not limited thereto. Any variations or alternatives that can be readily envisaged by those skilled in the art within the technical scope disclosed in the present disclosure are intended to be encompassed in the scope of protection of the present disclosure. Therefore, the scope of protection of the present disclosure should be determined by the scope of protection of the claims.

INDUSTRIAL APPLICABILITY

In the packaging method and package structure for a filter chip according to the embodiments of the present disclosure, a filter chip is adhered to a first surface of the circuit substrate by using an adhesive material, so that there is a certain gap between the surface acoustic wave transmitting region of the filter chip and the adhesive material or the first surface, whereby a cavity is formed between the filter chip and the circuit substrate after the filter chip is enclosed with an encapsulating material. Moreover, a pin of the filter chip is electrically connected to an external bump on the second surface of the circuit substrate through an interconnecting hole extending through the circuit substrate. In this way, it is unnecessary to form, by grinding, a cavity in the circuit substrate so that the packaging difficulty is reduced, and the wire bonding process or the gold ball flip-chip bonding process is not used so that the package structure for a filter can have a smaller and thinner size.

What is claimed is:

1. A method of packaging a filter chip, comprising:
providing a circuit substrate, wherein the circuit substrate comprises a first surface and a second surface remote from the first surface, wherein a circuit layer is pre-formed on the first surface, and a conductive layer covering the second surface is pre-formed on all regions of the second surface; at least one interconnecting hole extending through the circuit substrate is pre-formed in the circuit substrate;
fabricating a filtering functional layer on the filter chip;
covering the first surface and/or the filter chip with an adhesive material and forming at least one recessed cavity or at least one closed cavity in the adhesive material;
adhering the filter chip to the first surface of the circuit substrate via the adhesive material, such that at least one surface acoustic wave transmitting region of the filter chip corresponds to the at least one recessed cavity or closed cavity in the adhesive material to form a gap therebetween;
encapsulating the filter chip with an encapsulating material;
forming at least one interconnecting hole extending from the second surface to at least one pin of the filter chip to expose at least one chip pin bump or pad metal;
filling the at least one interconnecting hole with a conductive material, so that the conductive material is in electrical contact with the at least one chip pin bump or pad metal of the filter chip;
processing the conductive layer on the second surface to form a circuit layer; and
forming, on the second surface, at least one external pin pad electrically connected to the at least one chip pin bump or pad metal of the filter chip via the at least one interconnecting hole;
the covering the first surface and/or the filter chip with an adhesive material and forming at least one recessed cavity in the adhesive material comprises: covering the first surface with the adhesive material and partially removing the adhesive material to form at least one recessed cavity; and
the adhering the filter chip to the first surface of the circuit substrate via the adhesive material comprises: adhering, onto the adhesive material, the filter chip having protrusions on a side where the at least one surface acoustic wave transmitting region is located, so that the at least one surface acoustic wave transmitting region corresponds to the at least one recessed cavity in the adhesive material to form at least one gap therebetween.

2. The method according to claim 1, wherein the covering the first surface and/or the filter chip with an adhesive material and forming at least one recessed cavity in the adhesive material comprises:
covering the filter chip with the adhesive material; and
partially removing the adhesive material at at least one position corresponding to the at least one surface acoustic wave transmitting region to form the at least one recessed cavity from which the at least one surface acoustic wave transmitting region is exposed, so that at least one cavity wall at least partially surrounding the at least one surface acoustic wave transmitting region is formed by the adhesive material.

3. The method according to claim 1, wherein the covering the first surface and/or the filter chip with an adhesive material and forming at least one closed cavity in the adhesive material comprises:
covering the filter chip with a first adhesive material;
partially removing the first adhesive material to form the at least one recessed cavity corresponding to the at least one surface acoustic wave transmitting region; and
using a second adhesive material to close the at least one recessed cavity, so that the at least one closed cavity enclosing the at least one surface acoustic wave transmitting region is formed by the first adhesive material together with the second adhesive material.

4. The method according to claim 1, wherein the covering the first surface and/or the filter chip with an adhesive material and forming at least one recessed cavity in the adhesive material comprises:
covering the first surface with the adhesive material; and
partially removing the adhesive material to form at least one recessed cavity.

5. The method according to claim 1, wherein the protrusions comprise at least one pad metal bump on the at least one pin of the filter chip and at least one mechanical support bump disposed on the side where the at least one surface acoustic wave transmitting region is located.

6. The method according to claim 1, wherein
the forming at least one recessed cavity in the adhesive material comprises: forming, in the adhesive material, the at least one recessed cavity corresponding to at least one position of the at least one surface acoustic wave transmitting region, and at the same time, forming, in the adhesive material, the at least one interconnecting hole corresponding to at least one position of the at least one chip pin bump or pad metal of the filter chip; and
the adhering the filter chip to the first surface of the circuit substrate via the adhesive material comprises: adhering the filter chip to the first surface of the circuit substrate via the adhesive material, so that the at least one interconnecting hole in the adhesive material communicates with the at least one interconnecting hole in the circuit substrate to expose the at least one chip pin bump or pad metal.

7. The method according to claim 1, wherein after the encapsulating the filter chip with an encapsulating material, a method of forming the at least one interconnecting hole extending from the circuit substrate to at least one chip pin pad/bump further comprises:
removing the adhesive material covering the at least one interconnecting hole of the circuit substrate to expose at least one chip pin bump or pad metal of the filter chip through the at least one interconnecting hole.

8. The method according to claim 1, wherein before the filling the at least one interconnecting hole with a conductive material, the method further comprises:
forming, by depositing, a seed metal layer on an inner wall of the at least one interconnecting hole.

9. The method according to claim 1, wherein the forming, on the second surface, at least one external pin pad electrically connected to the at least one pin of the filter chip via the at least one interconnecting hole comprises:
forming an insulating layer on the circuit layer provided on the second surface;
partially removing the insulating layer to expose at least one external pin contact on the circuit layer provided on the second surface; and
forming, on the at least one external pin contact, at least one external pin pad electrically connected to the at least one external pin contact.

* * * * *